(12) United States Patent
Beintner et al.

(10) Patent No.: US 6,987,042 B2
(45) Date of Patent: Jan. 17, 2006

(54) METHOD OF FORMING A COLLAR USING SELECTIVE SIGE/AMORPHOUS SI ETCH

(75) Inventors: Jochen Beintner, Wappingers Falls, NY (US); Naim Moumen, Austin, TX (US); Porshia S. Wrschka, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 10/250,046

(22) Filed: May 30, 2003

(65) Prior Publication Data
US 2004/0241939 A1 Dec. 2, 2004

(51) Int. Cl.
*H01L 21/8242* (2006.01)
(52) U.S. Cl. ............... 438/241; 438/242; 438/243; 438/386
(58) Field of Classification Search ........... 438/241, 438/242, 243, 386, 379, 248–250, 393, 270, 438/271, 589, 253, 244, 387, 396; 257/304, 257/311, 312
See application file for complete search history.

(56) References Cited

U.S. PATENT DOCUMENTS

| | | | |
|---|---|---|---|
| 4,649,625 A | | 3/1987 | Lu |
| 5,395,786 A | | 3/1995 | Hsu et al. |
| 5,658,816 A | | 8/1997 | Rajeevakumar |
| 5,692,281 A | * | 12/1997 | Rajeevakumar ............ 29/25.42 |
| 6,310,375 B1 | * | 10/2001 | Schrems .................... 257/301 |
| 6,605,838 B1 | * | 8/2003 | Mandelman et al. ....... 257/305 |
| 6,653,678 B2 | * | 11/2003 | Chidambarrao et al. .... 257/301 |
| 6,677,205 B2 | * | 1/2004 | Beintner .................... 438/270 |
| 2003/0062568 A1 | | 4/2003 | Beintner |

* cited by examiner

*Primary Examiner*—Carl Whitehead, Jr.
*Assistant Examiner*—Yennhu B. Huynh
(74) *Attorney, Agent, or Firm*—Scully, Scott, Murphy & Presser; Todd M. C. Li

(57) ABSTRACT

A method of forming collar isolation for a trench storage memory cell structure is provided in which amorphous Si (a:Si) and silicon germanium (SiGe) are first formed into a trench structure. An etching process that is selective to a:Si as compared to SiGe is employed in defining the regions in which the collar isolation will be formed. The selective etching process employed in the present invention is a wet etch process that includes etching with HF, rinsing, etching with $NH_4OH$, rinsing, and drying with a monohydric alcohol such as isopropanol. The sequence of $NH_4OH$ etching and rinsing may be repeated any number of times. The conditions used in the selective etching process of the present invention are capable of etching a:Si at a faster rate than SiGe.

13 Claims, 9 Drawing Sheets

METHOD OF FORMING A COLLAR USING SELECTIVE SIGE/AMORPHOUS SI ETCH

BACKGROUND OF INVENTION

The present invention relates to semiconductor memory devices, and more particularly to a method of fabricating collar isolation for a trench memory cell device in which amorphous silicon (a:Si) and silicon germanium (SiGe) as well as a selective etching process are used in defining the collar isolation region.

A metal oxide semiconductor field effect transistor (MOSFET) is used in forming dynamic random access memory (DRAM) cells. A DRAM circuit typically includes an array of memory cells interconnected by rows and columns, which are known as wordlines and bitlines, respectively. Reading data from, or writing data to, memory cells is achieved by activating selective wordlines and bitlines. Typically, a DRAM cell comprises a MOSFET connected to a capacitor. The capacitor includes two electrodes that are separated by a node dielectric, while the MOSFET includes a gate and diffusion regions that are referred to as either the source or drain region, depending on the operation of the transistor.

There are different types of MOSFETs known to those skilled in the art. A planar MOSFET is a transistor where a surface of the channel region of the transistor is generally parallel to the primary surface of the substrate. A vertical MOSFET is a transistor where a surface of the channel region of the transistor is perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Trench capacitors are frequently employed with DRAM cells. A trench capacitor is a three-dimensional structure formed into a Si-containing substrate. This is normally formed by etching trenches of various dimensions into the Si-containing substrate. Trenches commonly have N+ doped polysilicon as one electrode of the capacitor (i.e., the storage node) and the other electrode of the capacitor is a buried plate that is formed via out-diffusion of dopants into a portion of the substrate surrounding the lower portion of the trench.

A typical trench storage memory cell is shown, for example, in FIG. 1. Specifically, the trench capacitor memory cell of FIG. 1 comprises substrate 10 having N+ bitline diffusion regions 12 formed therein. The substrate also includes a plurality of trench capacitor memory cells 14. Each trench capacitor memory cell includes trench capacitor 16 formed in a lower portion of the trench and vertical MOSFET 18 formed in an upper portion of the trench.

The trench capacitor includes N+ buried plate diffusion 20 formed about the exterior walls of the trench, node dielectric 22 lining the interior walls of the trench, and storage capacitor node conductor 24 formed within the trench on the exposed walls of the node dielectric.

The vertical MOSFET includes gate dielectric 26 formed on vertical sidewalls of the trench, and gate conductor 28 formed on the gate dielectric. The trench capacitors and the vertical MOSFET are isolated from each other by trench top oxide layer 30 and collar isolation oxide 32, yet the structures are in electrical communication through N+ buried strap diffusion region 34.

In addition to providing device isolation between the vertical MOSFET and the trench capacitor, the collar oxide 32 also provides a means to prevent current leakage from the vertical parasitic transistor 36 that exists on the sidewalls of the trench between the N+ buried strap diffusion regions and the N+ buried plate diffusion region.

One problem with the current processing flow is that collar oxide formation requires extra processing steps to define the length of the collar oxide. The extra processing steps required in the prior art for collar oxide formation increase the fabrication time as well as the cost. Moreover, in instances in which high aspect ratio trenches are employed, the thickness of conventional collar oxides makes it difficult to completely fill the lower regions of the trenches with a storage node conductor.

In view of the above drawbacks with the prior art, there is a continued need for providing a simple means for forming collar isolation for trench capacitor memory cells that can be integrated relatively easily into existing DRAM processes.

SUMMARY OF INVENTION

The present invention provides a simple, yet cost effective method of forming collar isolation for a trench storage memory cell structure. The collar isolation is formed in the present invention utilizing a method in which amorphous Si (a:Si) and silicon germanium (SiGe) are first formed into a trench structure that includes a node dielectric and a buried electrode plate. The SiGe is employed in the present invention as the storage node conductor and forms one of the electrodes of the capacitor. The other electrode of the capacitor is a buried plate electrode that is located about exterior portions of the trench. The node dielectric and the a:Si separate the two capacitor electrodes from each other.

An etching process that is selective to a:Si as compared to SiGe is employed in defining the regions in which the collar isolation will be formed. That is, an etching process that removes a:Si at a much greater rate than SiGe is employed in the present invention. The selective etching process employed in the present invention is a wet etch process that includes etching with HF, rinsing, etching with NH$_4$OH, rinsing, and drying with a monohydric alcohol such as isopropanol. The sequence of NH$_4$OH etching and rinsing may be repeated any number of times. The conditions used in the selective etching process of the present invention are capable of etching a:Si at a faster rate than SiGe. In accordance with the present invention, the etch rate for the a:Si is about 25 Å/min or greater, while the etch rate for the SiGe is about 4 Å/min or less.

Following the selective etching process, the collar isolation is formed in the regions created by the selective etch process and thereafter conventional processes are employed to complete the fabrication of the trench storage memory cell.

In broad terms, the method of the present invention comprises the steps of:

forming a structure comprising at least one trench having an upper region and a lower region in a surface of a semiconductor substrate, each trench including sidewalls that extend to a common bottom wall, an electrode located in the substrate at the lower region of the trench adjoining the sidewalls and the common bottom walls, and a node dielectric lining said sidewalls and common bottom wall;

forming amorphous Si on said node dielectric;

filling each trench with SiGe;

recessing portions of the amorphous Si and SiGe below an upper surface of the semiconductor substrate;

etching the amorphous Si selective to SiGe to form a collar isolation region on each sidewall; and forming a recessed collar dielectric material in said collar isolation region.

DETAILED DESCRIPTION

Figure 1:
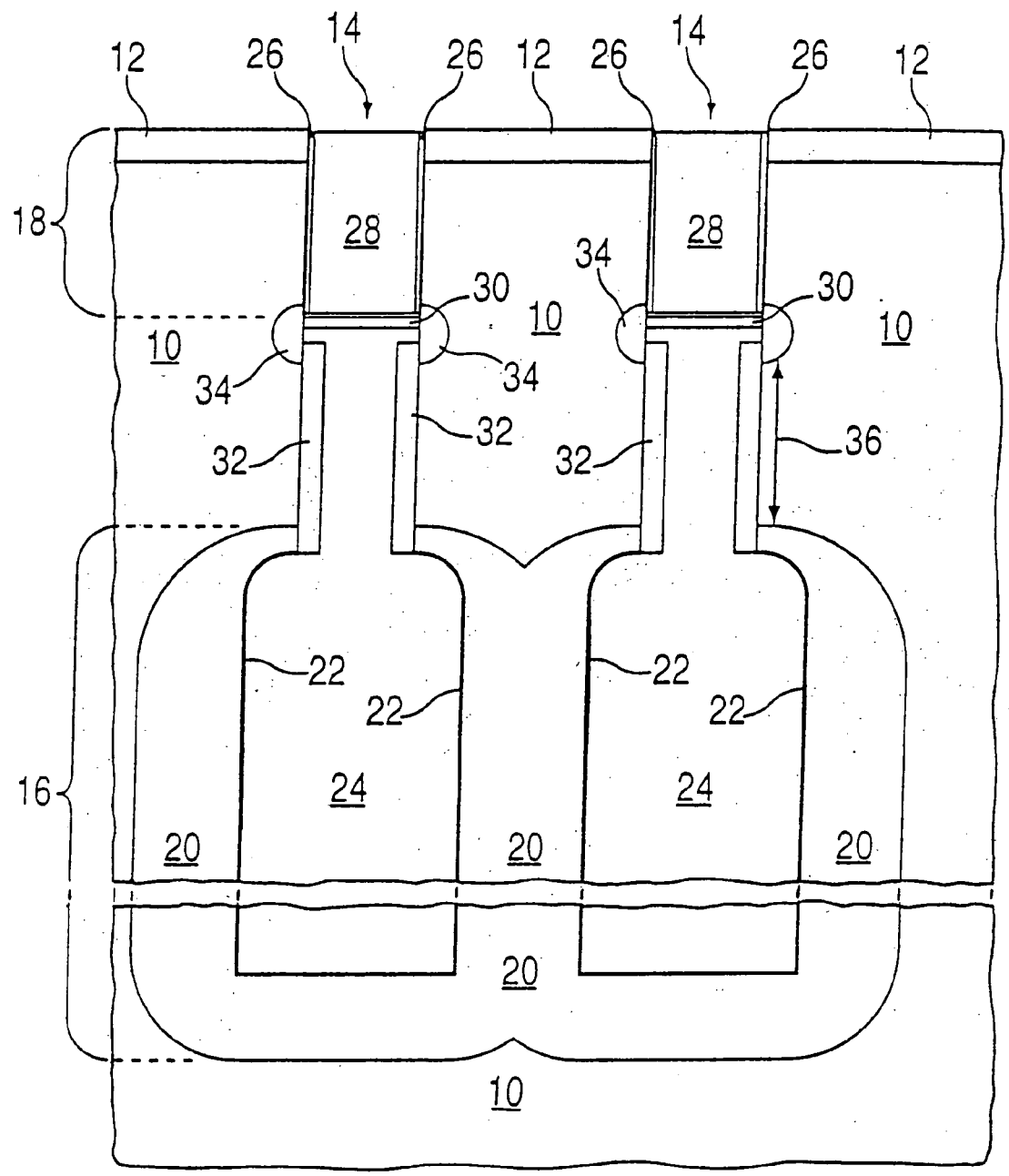
FIG. 1 is a pictorial representation (through a cross sectional view) illustrating a typical prior art trench capacitor memory cell in which the collar oxide region is formed utilizing conventional procedures.

The present invention, which provides a method of forming collar isolation for a trench capacitor memory cell structure, will now be described in greater detail by referring to the drawings that accompany the present application. In the drawings that follow, a single trench is shown to be formed into a semiconductor substrate. Despite showing the formation of a single trench, the present invention contemplates the formation of a plurality of such trenches formed in a semiconductor substrate.

Figure 2:
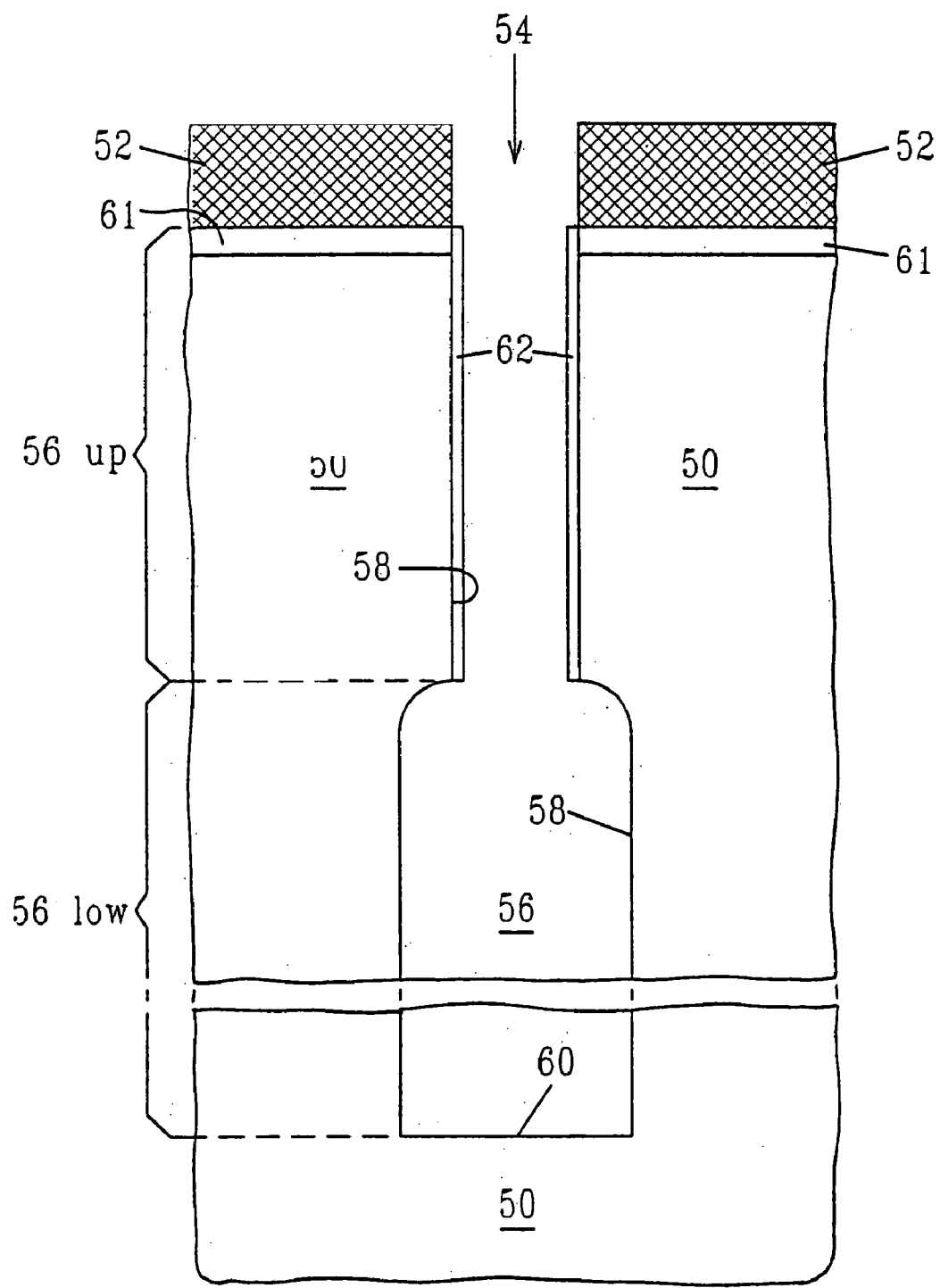
FIGS. 2–9 are pictorial representations (through cross sectional views) illustrating the basic processing steps of the present invention.

FIG. 2 shows an initial structure of the present invention. The initial structure shown in FIG. 2 comprises a semiconductor substrate 50, a patterned material layer 52 having at least one opening 54. located atop an upper surface of the semiconductor substrate 50, and at least one trench 56 formed through the at least one opening 54 into exposed portions of the semiconductor substrate 50. The at least one trench includes sidewalls 58 that extend to a common bottom wall 60 as well as an upper region and a lower region. The upper trench region is labeled as 56up, while the lower trench region is labeled as 56low. Although FIG. 2 shows a trench having a narrow upper trench 56up and a broader lower trench region 56low, the present invention is not limited to such a trench shape. Instead, any trench shape that is typically employed in fabricating trench capacitor memory cell structures is contemplated herein. The initial structure also shows an optional sacrificial collar 62 that is located on the sidewalls 58 in the upper trench region 56up, and diffusion regions 61 located at an upper surface region of the semiconductor substrate 50. As stated above, sacrificial collar 62 is optional and thus may not be used in some embodiments of the present invention. The description that follows however depicts the presence of the optional sacrificial collar 62.

The semiconductor substrate 50 of the initial structure shown in FIG. 2 is composed of any semiconducting material including, but not limited to: Si, Ge, SiGe, GaAs, InAs, InP and all other III/N compound semiconductors. The semiconductor substrate 50 may also include a layered substrate comprising the same or different semiconductor material including Si/Si, Si/SiGe as well as a silicon-on-insulator (SOI) substrate. The semiconductor substrate 50 may be of the n- or p-type depending on the desired device to be fabricated and the substrate 50 may also include various well regions, isolation regions and/or device regions formed therein. For clarity, these regions are not shown in the drawings of the present invention, but are nevertheless meant to be included with semiconductor substrate 50.

As stated above, the semiconductor substrate includes diffusion regions 61 that are formed by ion implantation and annealing.

Patterned material layer 52, which serves as the trench mask, is formed on a surface of the semiconductor substrate 50 utilizing processes that are well known to those skilled in the art including deposition and/or thermal growing followed by lithography and etching. The patterned material layer 52 may comprise a single material layer, as shown, or alternatively, the patterned material layer 52 may comprise a multilayered structure. For example, the patterned material layer 52 may comprise an oxide, nitride or a doped silicate glass, or a stack including two or more of the aforementioned materials may be employed. A preferred patterned material layer 52 employed in the present invention is a stack of a thermally grown oxide and a deposited nitride.

As stated above, a conventional deposition process such as chemical vapor deposition (CVD), plasma-assisted CVD, evaporation, or chemical solution deposition may be employed in forming the material layer. Alternatively, the material layer may be formed by a thermal oxidation or nitridation process, or a combination of thermal growing and deposition may be employed in forming the same.

Following application of the material layer to the surface of semiconductor substrate 50, the material layer is then patterned into patterned material layer 52 using lithography and etching. The lithography step employed in the present application includes the steps of applying a photoresist to the material layer, exposing the photoresist to a desired pattern of radiation and developing the pattern into the photoresist using a conventional resist developer. In the present application, the pattern is a trench pattern. The pattern is then transferred into the underlying material layer using a conventional etching process such as reactive-ion etching, ion beam etching, plasma etching or laser ablation that is highly selective in removing material 52 as compared to photoresist. This etching step, which also contemplates a combination of the aforementioned etching processes, stops on an upper surface of the semiconductor substrate 50. The patterned material layer 52 includes at least one opening 54 that exposes a portion of the semiconductor substrate 50. After the pattern has been transferred into the material layer, the photoresist may be removed utilizing a conventional stripping process.

Trenches 56 are now formed into the semiconductor substrate 50 through opening 54. The trenches 56 may be formed used a timed etching process wherein the entire trench or a portion thereof is formed into semiconductor substrate 50. The description that follows describes a scheme in which a partial trench is first formed and then the sacrificial collar 62 is formed onto portions of the trench sidewalls. It should be noted that the present invention could be used with trenches in which an optional sacrificial collar is used to provide a mask for buried plate doping as well as bottle shape formation. The essence of a sacrificial collar scheme is to protect the top portion of the trench by a material that acts as a diffusion barrier during electrode formation. The optional sacrificial collar also acts as a selective etch mask during bottle formation. There are many different sacrificial collar schemes, which are well known to those skilled in the art that may be used in the present invention. Although various collar schemes may be used, the following provides an example of one type of sacrificial collar scheme that may be employed in the present invention. The description of the following sacrificial collar scheme thus does not limit the scope of the present invention since any known sacrificial collar scheme may be used, or the collar scheme may be omitted.

Partial etching of trenches 56 into the exposed portions of the semiconductor substrate 50, not protected with patterned material layer 52, is then performed utilizing a timed etching process that is highly selective in removing semiconductor material as compared to the material layer. An optional sacrificial collar 62, which is located on the sidewalls 58 in the upper trench region 56up, may then formed on the exposed walls of the partially etched trench. The sacrificial collar typically comprises a stack of a bottom SiN layer and a top oxidelayer. The horizontal surface of the sacrificial collar formed on the bottom surface of each partially etched trench is then removed using a conventional etching process such as reactive-ion etching, and thereafter the exposed substrate is subjected to further timed etching so as to complete the formation of each trench 56.

Next, a conventional bottle etching process that is highly selective in removing substrate as compared to the sacrificial collar may optionally be performed so as to provide trenches that have a narrow upper portion and a broad lower portion. Suitable bottle etching processes that can be utilized in the present invention include the processes disclosed, for example, in U.S. Pat. No. 4,649,625 to Lu; U.S. Pat. No. 5,658,816 to Rajeevakumar; and U.S. Pat. No. 5,692,281 to Rajeevakumar, the entire contents of each is incorporated herein by reference.

Next, a buried plate electrode 64 (see, FIG. 3) is formed about the exterior walls of the lower trench regions by using a process that is capable of diffusing dopant through the trench walls. One technique that can be used in forming the buried plate electrode 64 is described, for example, in U.S. Pat. No. 5,395,786, the content of which is incorporated herein by reference. At this point of the present invention, sacrificial collar 62 may be stripped or it may remain in the trench.

Node dielectric 66 (see, FIG. 3) is then formed in each trench, including on optional sacrificial collar region 62, and on the exposed trench walls in the lower region of each trench using either a conventional deposition process or a thermal growing process well known to those skilled in the art. Node dielectric 66 employed at this stage of the present invention comprises any dielectric material including, but not limited to: $Si_3N_4$, $SiO_2$, $Al_2O_3$, $ZrO_2$, and $RuO_2$. The thickness of the node dielectric 66 may vary and is not critical to the present invention. Typically, however, the node dielectric 66 has a thickness of from about 2.5 to about 7.0 nm, with a thickness of from about 3.0 to about 5.0 nm being more highly preferred.

Figure 3:
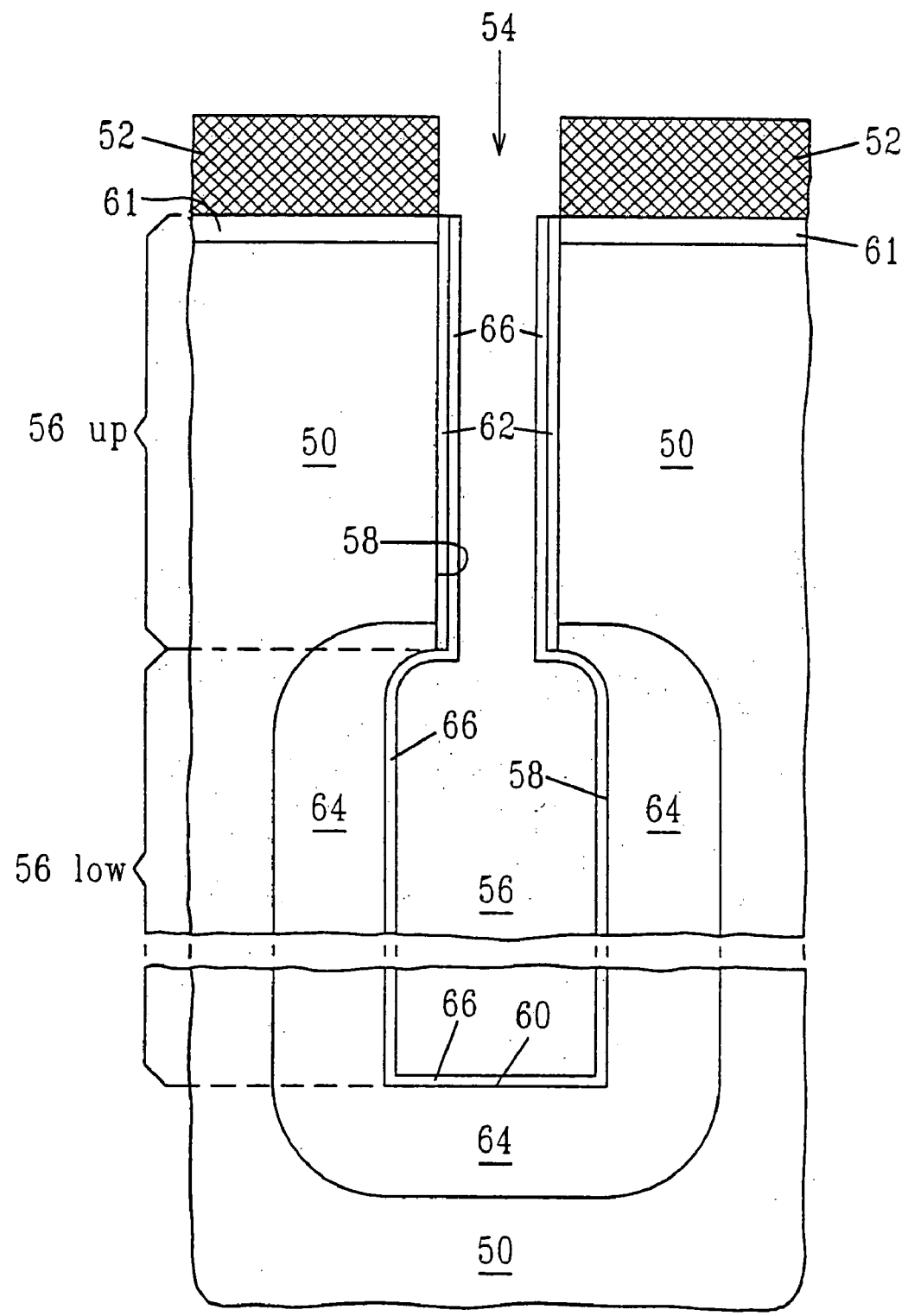

After providing the structure shown in FIG. 3, a thin layer of amorphous Si 68 is formed atop node dielectric 66 using a conventional low-pressure chemical vapor deposition (LPCVD) process or a rapid thermal chemical vapor deposition (RTCVD) process. The layer of a:Si 68 formed at this stage of the present invention has a thickness of from about 50 to about 600 nm, with a thickness of from about 200 to about 300 nm being more highly preferred.

Figure 4:
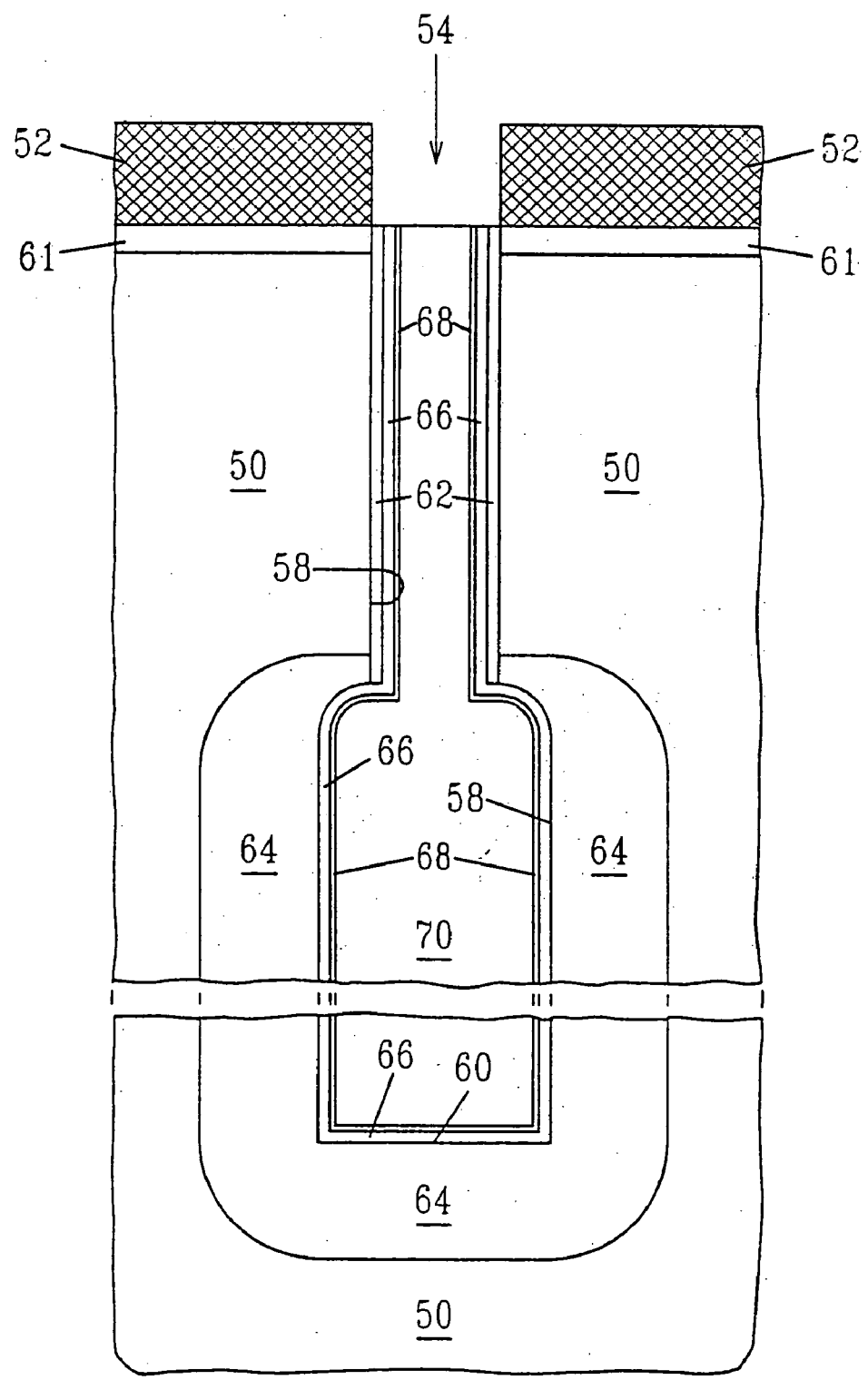

A layer of SiGe 70, which serves as the storage capacitor node conductor, is then formed in each trench by deposition and, if needed, the storage capacitor node conductor is planarized to the upper surface of material layer 52 using a conventional planarization process such as chemical-mechanical polishing (CMP) or grinding. The SiGe layer 70 is a doped layer which may be formed utilizing an in-situ doping deposition process, or the SiGe layer 70 may be formed by layered deposition followed by gas phase or plasma immersion doping. The resultant structure including the layer of a:Si 68 and the layer of SiGe 70 is shown, for example, in FIG. 4. Note the designations 56up and 56low have been omitted in FIG. 4 as well as the remaining drawings for clarity.

Following deposition and optional planarization, portions of the layer of a:Si 68 and SiGe 70 are recessed to a predetermined depth. The node dielectric may be removed by methods familiar to those in the field, e.g., wet chemistry. The recessed portions of a:Si 68 and SiGe 70 are selectively etched utilizing a wet etch process that selectively etches a:Si at a faster rate than SiGe providing the structure shown, for example, in FIG. 5.

Specifically, the selective etching process employed in the present invention is a wet etch process that includes etching with HF, rinsing, etching with $NH_4OH$, rinsing, and drying with a monohydric alcohol such as isopropanol. The sequence of $NH_4OH$ etching and rinsing may be repeated any number of times. The selective etching process of the present invention is performed using conditions in which a:Si is etched at a faster rate than SiGe. In accordance with the present invention, the etch rate for a:Si is about 25 Å/min or greater, while the etch rate for SiGe is about 4 Å/min or less.

The etch rate may vary with the concentration of $NH_4OH$ and the temperature of the chemistry. In the present invention, the applicants have determined that the temperature is the best way to control the etch rate. A reason for this is that the etch tool permits one to change the temperature much easier, and over a wider range, as compared with the concentration. Moreover, from a process point of view it is easier and cheaper to run the etch with lower concentration and varying the temperature than varying the concentration within a fixed temperature. The purpose of the HF etch is to remove any oxide from the a:Si and SiGe layers. The HF etch typically includes an aqueous solution of HF in which the ratio of $H_2O$:HF is from about 1:1 to about 500:1, with a ratio of $H_2O$:HF of from about 100:1 to about 200:1 being more highly preferred. The HF etch is carried out for a time period of from about 1 to about 10 minutes, with a time period of from about 1 to about 3 minutes being more highly preferred. The HF etching is typically performed at a temperature of from about 23° C. to about 60° C., with an HF etching temperature of from about 24° C. to about 30° C. being more highly preferred.

After HF etching, a rinsing step that is carried out in deionized water is employed in the selective etching process. The deionized rinsing step forms oxide on exposed portions of SiGe at a faster rate than on exposed portion of a:Si. The rinsing step is performed at a temperature of from about 24° C. to about 30° C.

Following the rinsing step, the structure including the a:Si and SiGe layers is brought into contact with an $NH_4OH$ etchant. The $NH_4OH$ etchant selectively removes a:Si. The $NH_4OH$ etch typically includes an aqueous solution of $NH_4OH$ in which the ratio of $H_2O$:$NH_4OH$ is from about 3:1 to about 500:1, with a ratio of $H_2O$:$NH_4OH$ of from about 10:1 to about 200:1 being more highly preferred. The $NH_4OH$ etching is carried out for a time period of from about 1 to about 15 minutes, with a time period of from about 3 to about 10 minutes being more highly preferred. The $NH_4OH$ etching is typically performed at a temperature of from about 23° C. to about 65° C., with an $NH_4OH$ etching temperature of from about 35° C. to about 60° C. being more highly preferred.

Following $NH_4OH$ etching, the structure is then rinsed with deionized water and then the etched structure is dried by contacting with a monohydric alcohol such as methanol, ethanol, isopropanol, and the like. The drying may be performed at a temperature of from about 25° C. to about 80° C.

The sequence of NH$_4$OH etching and rinsing may be repeated any number of times. In some embodiment, no rinsing step is required between NH$_4$OH etching steps. The following conditions represent a highly preferred selective etching process that may be employed in the present invention:

Step 1: HF (200:1; 3 min etch at 30 Â° C.)
Step 2: rinse
Step 3: NH$_4$OH (180:1; 48 Â° C.; 60 seconds+624 seconds)
Step 4: rinse
Step 5: NH$_4$OH (180:1; 48 Â° C.; 60 seconds+624 seconds)
Step 6: Rinse
Step 7: NH$_4$OH (180:1; 48 Â° C.; 60 seconds+624 seconds)
Step 8: NH$_4$OH (180:1; 48 Â° C.; 60 seconds+720 seconds)
Step 9: rinse
Step 10: NH$_4$OH (180:1; 48 Â° C.; 60 seconds+940 seconds)
Step 11: rinse
Step 12: NH$_4$OH (180:1; 48 Â° C.; 60 seconds+800 seconds)
Step 13: rinse
Step 14: isopropanol drying.

Figure 5:
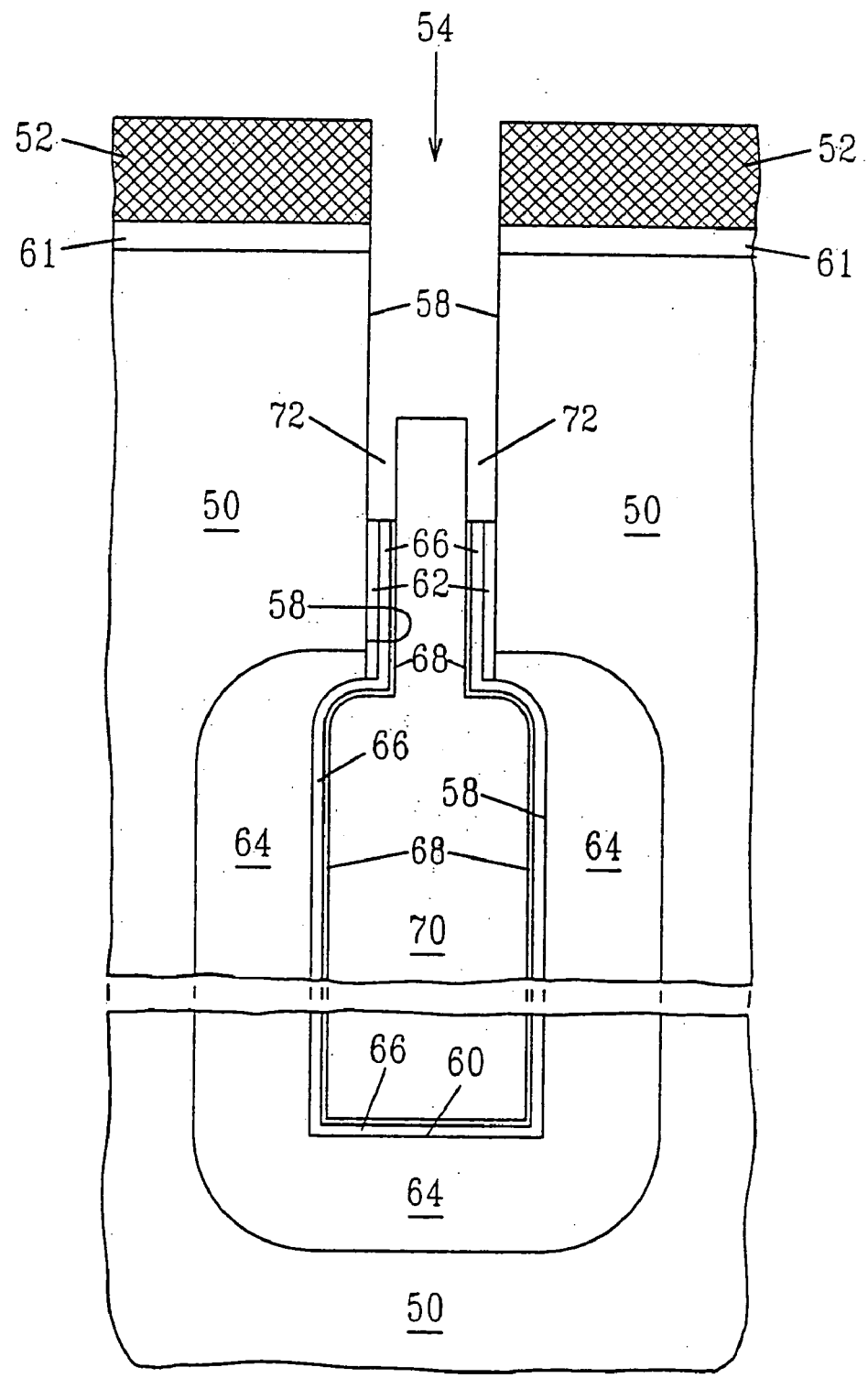

As stated above, the selective etching of a:Si to SiGe provides the structure illustrated in FIG. 5. In FIG. 5, reference numeral 72 denotes the collar isolation regions formed on each sidewall 58.

Figure 6:
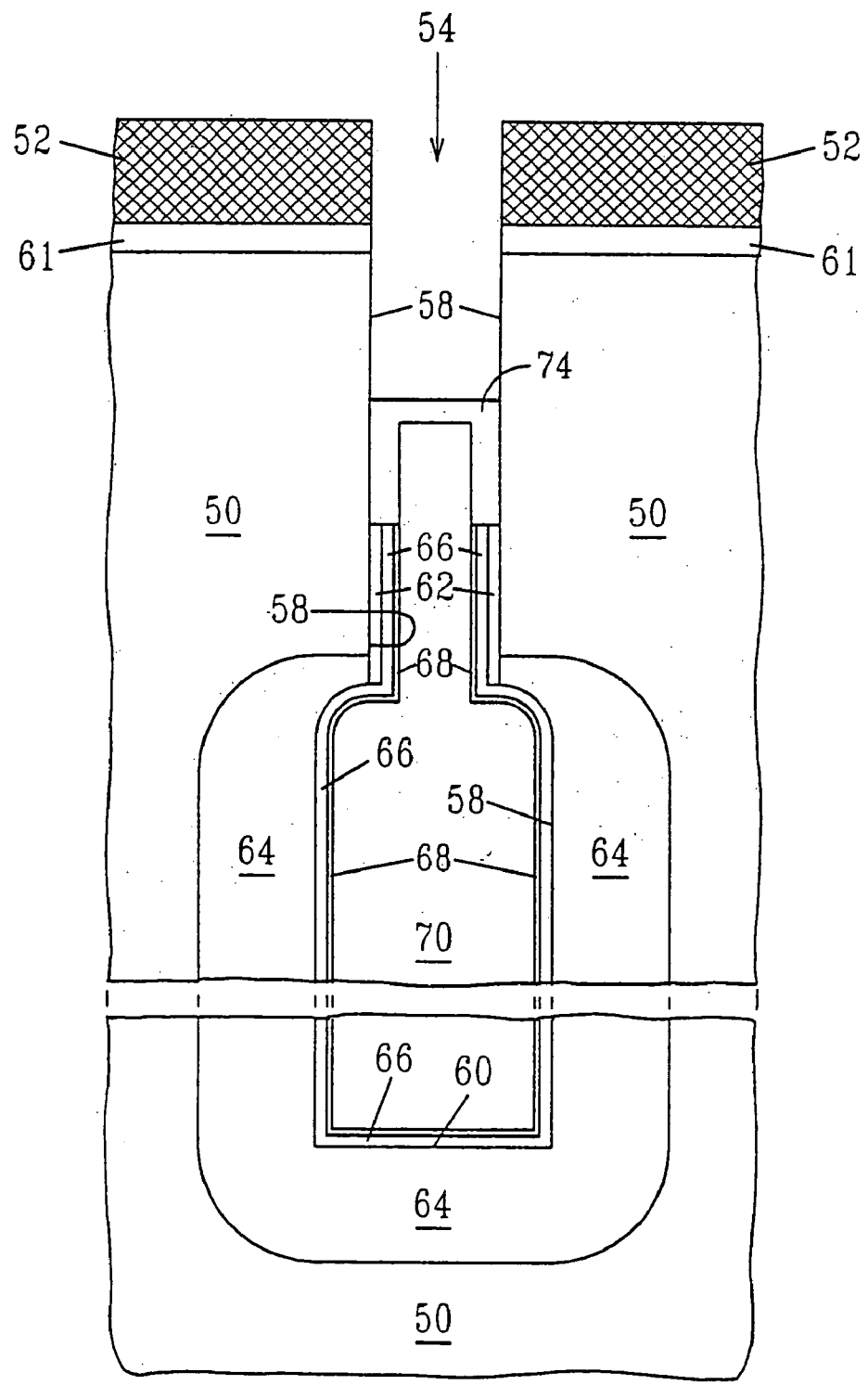

Next, and as shown in FIG. 6, a collar isolation material 74, such as an oxide, is formed in each collar isolation region 72 as well as atop horizontal portions of etched SiGe layer 70. The collar isolation material 74 may, or may not include voids, therein. The collar isolation material is formed by a deposition process such as chemical vapor deposition or by a thermal growing process.

Figure 7:
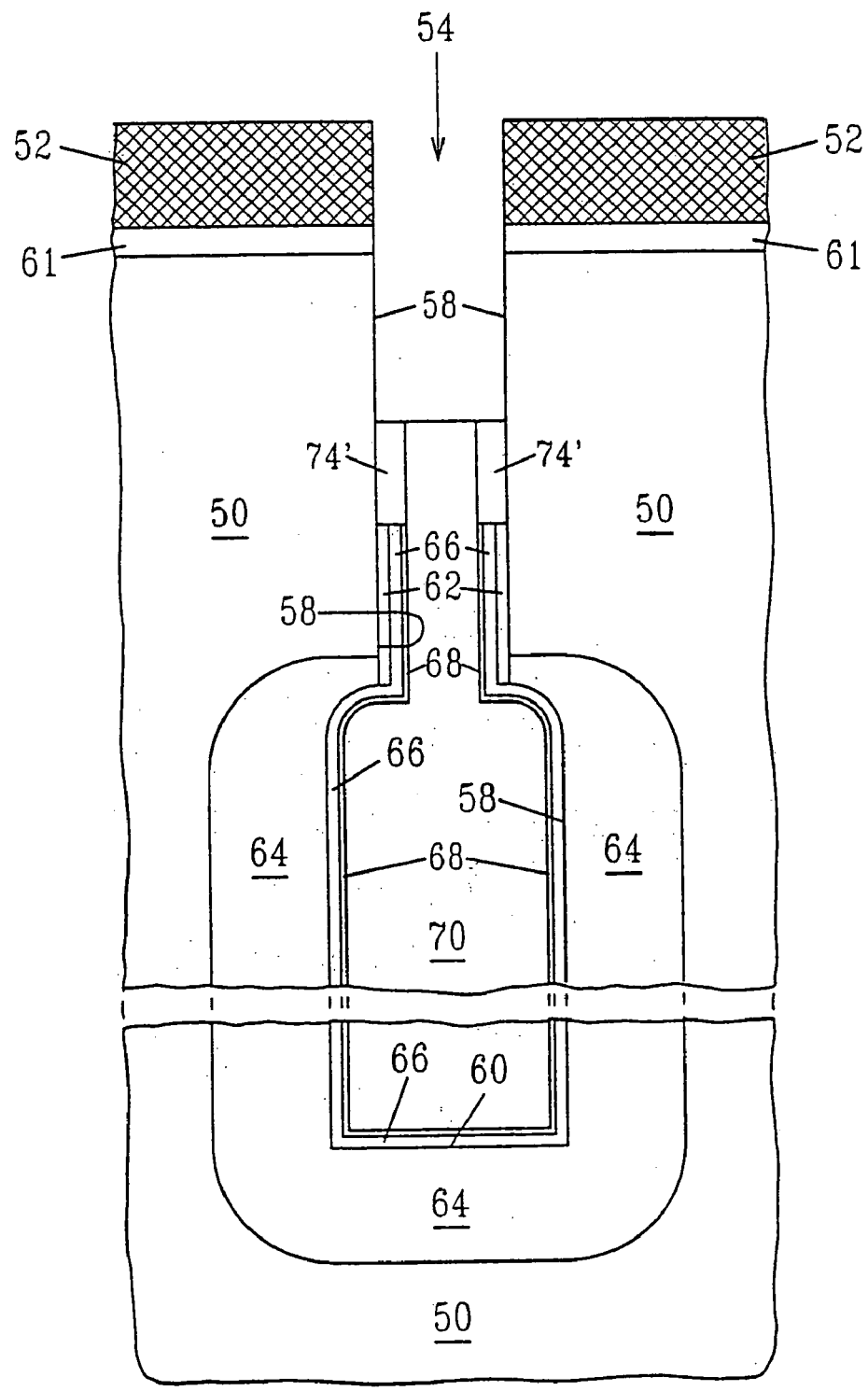

After providing the structure shown in FIG. 6, portions of the collar oxide 74 material are removed atop the horizontal etched SiGe layer 70 providing the structure shown in FIG. 7. In FIG. 7, reference numeral 74' denotes the collar isolation provided by the method of the present invention. In some embodiments of the present invention, the structures shown in FIGS. 6 and 7 may be achieved in a one-step oxide etching process.

Figure 8:
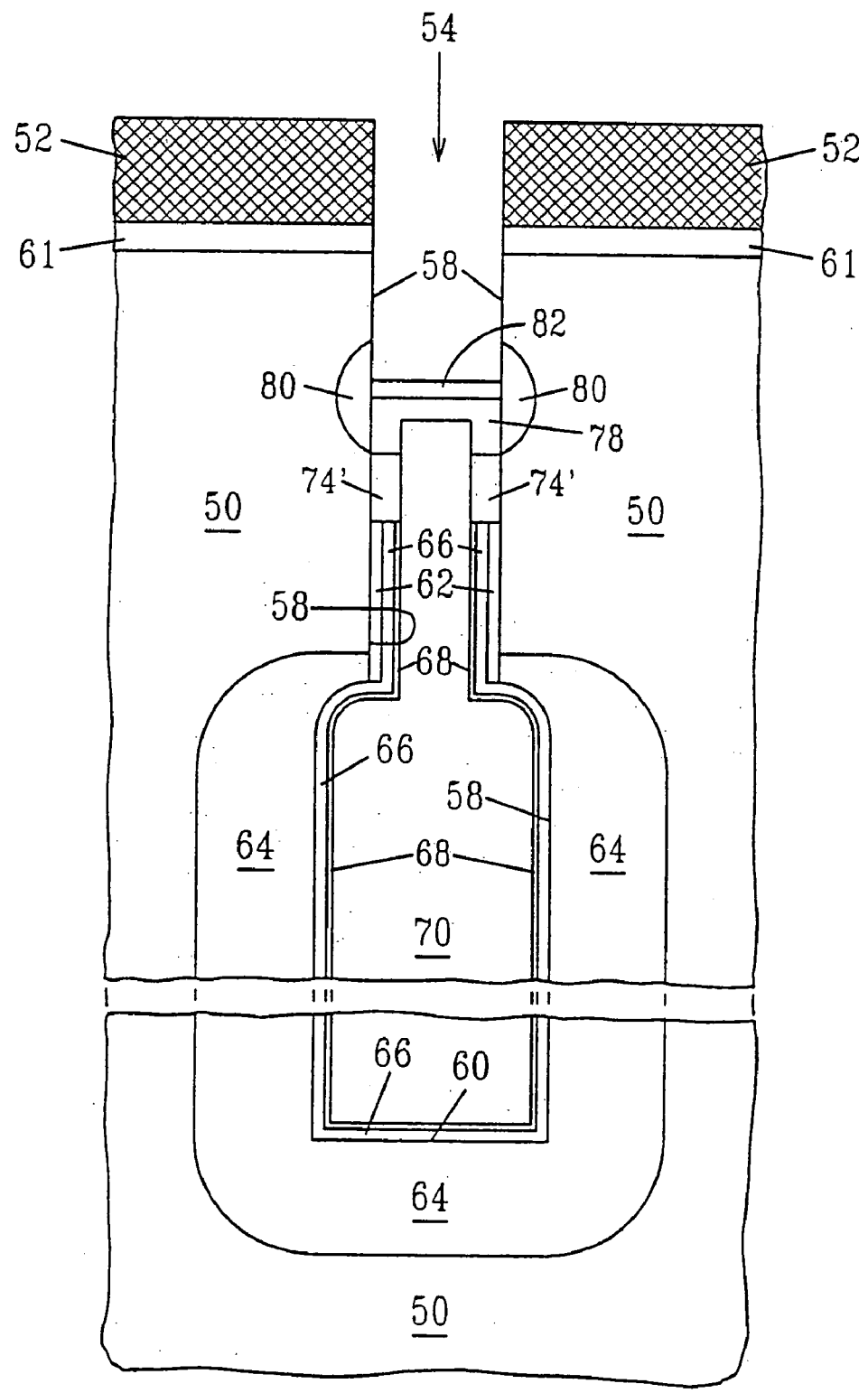

Portions of the collar isolation 74' are then recessed utilizing a timed etched process to a depth in which buried strap diffusion regions will be formed. Next, a conductor region 78, such as N+ poly or a layer of SiGe and dopant, is deposited and the dopant is diffused through an opening at the exposed sidewalls forming buried strap regions 80. Trench top oxide 82 is formed on the doped conductor 78 using a conventional deposition process providing the structure shown in FIG. 8.

Figure 9:
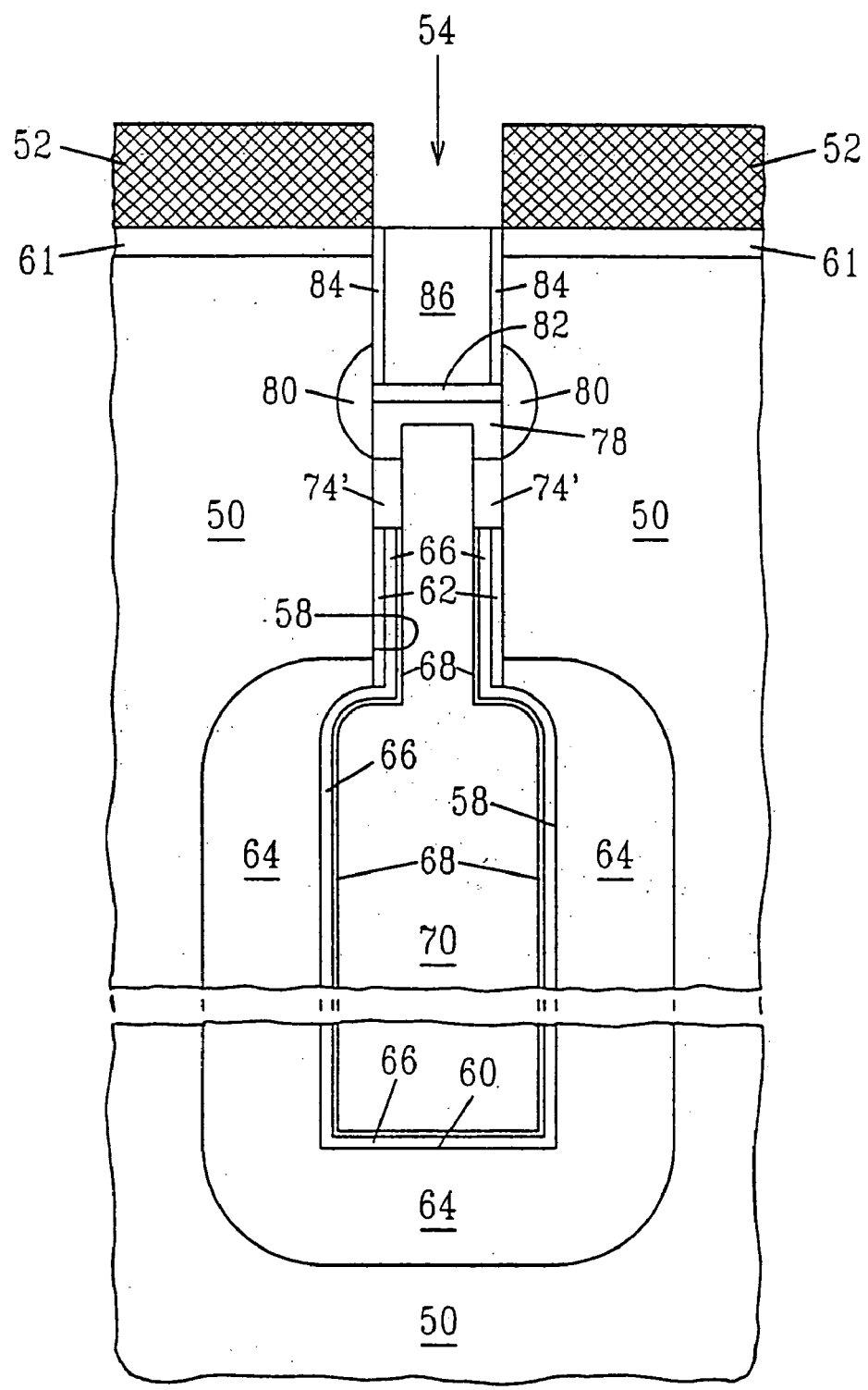

A vertical gate dielectric such as SiO$_2$ (labeled as 84 in FIG. 9) is then formed on the exposed trench walls using a thermal growing process or a conventional deposition process and thereafter, a gate conductor material 86 such as poly Si, a metal or a metallic silicide is formed atop the trench top oxide providing the structure shown in FIG. 9. The patterned material layer 52 may now be removed from the surface of the semiconductor substrate 50 using a conventional stripping process that is capable of removing the material layer therefrom. Further processing may continue so as to form wordlines, bitline contacts, etc.

Although the drawings and description above illustrate a vertical device, the method of the present invention may be used in forming other types of MOSFET structures such as, for example, a planar device. In making the planar device, the a:Si and SiGe layers are not recessed much below the upper surface of the semiconductor substrate 50. Moreover, in the planar device, the buried strap would be at the top of the trench and the gate would be built over it away from the trench. It is also noted that the etch chemistry described hereinabove may be used in other applications in which exposed surfaces of a:Si and SiGe are present.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a collar isolation region in a trench memory cell structure comprising the steps of:
    forming a structure comprising at least one trench having an upper region and a lower region in a surface of a semiconductor substrate, each trench including sidewalls that extend to a common bottom wall, an electrode located in the substrate at the lower region of the trench adjoining the sidewalls and the common bottom walls, and a node dielectric lining said sidewalls and common bottom wall;
    forming amorphous Si on said node dielectric;
    filling each trench with SiGe;
    recessing portions of the amorphous Si and SiGe below an upper surface of the semiconductor substrate;
    etching the amorphous Si selective to SiGe to form a collar isolation region on each sidewall; and
    forming a recessed collar dielectric material in said collar isolation region.

2. The method of claim 1 wherein the at least one trench is bottled shaped.

3. The method of claim 1 wherein said electrode is formed using a sacrificial collar scheme.

4. The method of claim 1 wherein the forming of the amorphous Si comprises a deposition process selected from low pressure chemical vapor deposition or rapid thermal chemical vapor deposition.

5. The method of claim 1 wherein the forming each trench with SiGe comprises an in-situ-doping deposition process or layered deposition followed by gas phase or plasma immersion doping.

6. The method of claim 1 wherein the etching is performed using a wet chemical etching process in which the amorphous Si is removed at a faster rate than the SiGe.

7. The method of claim 6 wherein the rate of amorphous Si removal is about 25 Â·/min or greater and the rate of SiGe removal is about 4 Â·/min or less.

8. The method of claim 6 wherein the wet chemical etching includes etching with an aqueous solution of HF; rinsing with deionized water, etching with an aqueous solution of NH$_4$OH;
    rinsing with deionized water; and drying with a monohydric alcohol.

9. The method of claim 8 wherein the aqueous solution of HF comprises a ratio of H$_2$O:HF of from about 1:1 to about 500:1 and the HF etching occurs at a temperature of from about 23 Â° C. to about 60 Â° C.

10. The method of claim 8 wherein the aqueous solution of NH$_4$OH comprises a ratio of H$_2$O:NH$_4$OH of from about 3:1 to about 500:1 and the $NH_4OH$ etching occurs at a temperature of from about 23° C. to about 65° C.

11. The method of claim 1 wherein the etching comprises the steps of HF etching; rinsing; $NH_4OH$ etching; rinsing; $NH_4OH$ etching; rinsing; $NH_4OH$ etching; $NH_4OH$ etching; rinsing;
$NH_4OH$ etching; rinsing; $NH_4OH$ etching; rinsing and isopropanol drying.

12. The method of claim 1 wherein the collar dielectric material is a deposited or thermally grown oxide.

13. The method of claim 1 further comprising forming a metal oxide semiconductor field effect transistor atop the recessed collar dielectric material.

* * * * *